United States Patent
Jang et al.

(10) Patent No.: US 7,505,023 B2
(45) Date of Patent: Mar. 17, 2009

(54) BUILT-IN GATE DRIVER AND DISPLAY DEVICE HAVING THE SAME

(75) Inventors: Yong Ho Jang, Seongnam-si (KR); Binn Kim, Seoul (KR); Su Hwan Moon, Gumi-si (KR); Soo Young Yoon, Goyang-si (KR)

(73) Assignee: LG. Display Co., Ltd., Seoul (KR)

( * ) Notice: Subject to any disclaimer, the term of this patent is extended or adjusted under 35 U.S.C. 154(b) by 672 days.

(21) Appl. No.: 11/166,826

(22) Filed: Jun. 23, 2005

(65) Prior Publication Data
US 2006/0044247 A1  Mar. 2, 2006

(30) Foreign Application Priority Data
Aug. 31, 2004  (KR) ...................... 10-2004-0069145

(51) Int. Cl.
  *G09G 3/36*  (2006.01)
(52) U.S. Cl. ...................................... 345/100
(58) Field of Classification Search ........... 345/98–100; 377/57–68
See application file for complete search history.

(56) References Cited

U.S. PATENT DOCUMENTS 5,410,583 A * 4/1995 Weisbrod et al. ............... 377/75
7,038,653 B2 * 5/2006 Moon ......................... 345/100

* cited by examiner

*Primary Examiner*—Amr Awad
*Assistant Examiner*—Randal Willis
(74) *Attorney, Agent, or Firm*—Brinks Hofer Gilson & Lione

(57) ABSTRACT

A built-in gate driver having an improved reliability and a display device having the same are provided. A transistor controlled by an output signal of a next stage is further provided and thus a node (Q) is rapidly discharged. Accordingly, the multi-output signals due to the reduced discharge of the node (Q) caused by the degradation of the transistor controlled by a node QB can be prevented. By including only one transistor for controlling the charge of the start pulse signal on the node (Q), it is possible to prevent a malfunction from occurring when the transistor connected to the clock is degraded by the periodic clock of a high state. Also, an image quality and the reliability of the gate driver can be improved.

4 Claims, 6 Drawing Sheets

BUILT-IN GATE DRIVER AND DISPLAY DEVICE HAVING THE SAME

PRIORITY CLAIM

This application claims the benefit of priority from Korean Application No. 69145/2004, filed Aug. 31, 2004, which is incorporated herein by reference.

BACKGROUND OF THE INVENTION

1. Field of the Invention

The present invention relates to a display device, and more particularly, to a built-in gate driver having an improved reliability and a display device having the same.

2. Description of the Related Art

Display devices such as an active matrix type (AM) liquid crystal display device (LCD) and an AM organic light emitting display device (OLED), which display an image by driving pixels arranged in an active matrix, are being actively researched.

The AM LCD adjusts a light transmittance of a liquid crystal layer by supplying a data voltage according to image information to pixels arranged in an active matrix, thereby displaying a desired image. The AM LCD includes a liquid crystal panel on which pixels are arranged in a matrix, and a gate driver and a data driver for driving the liquid crystal panel.

A built-in LCD has been developed in which a gate driver and/or a data driver are/is installed on the liquid crystal panel so as to reduce manufacturing costs.

In the case of the built-in driver, the liquid crystal panel and the gate driver are simultaneously manufactured. The data driver may or may not be installed within the built-in LCD.

The gate driver includes a plurality of stages for sequentially supplying output signals to respective gate lines. The data driver may also include a plurality of stages. FIG. 1 is a block diagram of a related art gate driver. Referring to FIG. 1, the related art gate driver is configured using one shift resister. The shift resister includes a plurality of stages ST1 to STn connected in cascade. The shift register includes as many stages ST1 to STn as there are number of gate lines in the liquid crystal panel. For example, when the number of gate lines is 193, the number of stages is 193. An output port of a current stage is connected to an input port of the next stage so that an output signal of the current stage initiates an operation of the next stage. Also, a gate line is connected to an output port of each stage. Accordingly, an output signal of each stage is supplied to the gate line and an input port of the next stage.

Since no previous stage exists before a first stage ST1, a start pulse signal SP (a forcible signal) is inputted to the first stage ST1 to initiate the first stage ST1. The start pulse signal is a pulse synchronized with a vertical sync signal Vsyn.

Two or more clocks C1 and C2 having a voltage pulse of a high state are sequentially inputted to each stage. Although only two clocks are inputted to each stage in FIG. 1, 3 or 4 clocks may be inputted to each stage.

According to this structure, output signals are sequentially outputted from the respective stages and gate lines corresponding to these output signals are selected.

FIG. 2 is a detailed circuit diagram of a first stage of a shift register shown in FIG. 1. Driving waveforms for the circuit shown in FIG. 2 are illustrated in FIG. 3. Although only the first stage is illustrated in FIG. 2 for convenience of description, the other stages have the same transistor structure as the first stage.

Referring to FIG. 2, the first stage ST1 includes first to seventh transistors T1 to T7. The first transistor T1 has a gate and a drain commonly connected to the start pulse signal SP and a source connected to a drain of the second transistor T2. In the case of the other stages, an output signal of a previous stage may be connected to a gate and drain of a first transistor T1.

The second transistor T2 has a gate connected to a second clock C2, a drain connected to the source of the first transistor T1, and a source connected to a node Q.

The third transistor T3 has a gate connected to a node QB, a drain connected to the node Q, and a source connected to a first supply voltage VSS.

The fourth transistor T4 has a gate connected to the second clock C2, a drain connected to a second supply voltage VDD, and a source connected to the node QB.

The fifth transistor T5 has a gate connected to the start pulse signal SP, a drain connected to the node QB, and a source connected to the first supply voltage VSS.

The sixth transistor T6 has a gate connected to the node Q, a drain connected to the first clock C1, and a source connected to the first gate line GL1.

The seventh transistor T7 has a gate connected to the node QB, a drain connected to the first gate line GL1, and a source connected to the first supply voltage VSS.

An operation of the first stage ST1 will be described with reference to FIGS. 2 and 3. Referring to FIG. 3, the first clock C1 generates a first periodic pulse and the second clock C2 generates a second periodic pulse. A phase of the first periodic pulse is opposite to that of the second periodic pulse. The start pulse SP is generated in synchronization with the second clock C2.

Initially, when the second clock C2 and the start pulse signal SP are at a high state and inputted to the shift register, the second transistor T2 is turned on and the start pulse signal SP is charged on the node Q via the first transistor T1. The first transistor T1 serves as a diode. That is, in the first transistor T1, a current flows in the forward direction (from drain to source) and does not flow in the reverse direction (from source to drain). Accordingly, when the start pulse signal SP is at a high state the signal is applied to both the drain and the gate of the first transistor T1. The first transistor T1 is turned on and the start pulse signal SP passes through the first transistor T1. The start pulse signal SP charged on the node Q is blocked by the first transistor T1 and is prevented from being discharged. The node Q is set (that is, initialized) by the start pulse signal SP. While the start pulse signal SP is charged on the node Q, the fourth transistor T4 is turned on by the second clock C2 and the second supply voltage VDD is charge on the node QB. Meanwhile, the fifth transistor T5 is turned on by the start pulse signal SP and thus the node QB is discharged to the first supply voltage VSS. Accordingly, the node QB is maintained at a low voltage.

When the first clock C1 is at a high state, a voltage of the node Q is increased about twice due to a bootstrapping phenomenon caused by a floating state of the node Q.

When the first clock C1 is at a high state, the second clock C2 is at a low state. Due to the second clock C2 being at a low state, the second transistor T2 is turned off and the third transistor T3 is also turned off by the node QB being at a low voltage, causing the node Q to be in a floating state. When the first clock C1 is applied to the sixth transistor T6, the voltage of the node Q is increased by the first clock C1 due to a capacitor Cgd between the gate and drain of the sixth transistor T6. Accordingly, the sixth transistor T6 is turned on and the first clock C1 is outputted as a first output signal Vg1. At this time, the node QB is maintained at a low voltage.

When the second clock C2 is again inputted, the fourth transistor T4 is turned on and the second supply voltage VDD is charged on the node QB. The third and seventh transistors T3 and T7 are turned on by the second supply voltage at the node QB. While the node Q is discharged through the third transistor T3, the first gate line GL1 is discharged through seventh transistor T7. Accordingly, the node Q is reset to the first supply voltage This process is repeated per frame. That is, the first output signal Vg1 is outputted from the first stage ST1 once per frame. A similar output signal is outputted from each of the remaining stages ST2 to STn once per frame. The respective output signals of the respective stages for each frame are delayed on a clock basis and thus are sequentially outputted.

The above-constructed gate driver generates an output signal of a high state for a very short period and is maintained at a low state during the remaining period.

In order to maintain the output signal at a low state, the node QB must be maintained at a high state. The node QB is maintained at a high state during most of the period in each frame, during which the third and seventh transistors T3 and T7 connected to the node QB receive a considerable bias stress. This bias stress is accumulated at every frame. When the gate driver is driven for a long time, the accumulated bias stress causes the third and seventh transistors T3 and T7 to be degraded, leading to a change in their characteristics (for example, a threshold voltage). A threshold voltage of 1~2V may be degraded to 10V or higher.

In addition, a driving characteristic of the second transistor T2 is also degraded as shown in Table 1 below. Table 1 shows a change in a characteristic of each transistor when it is driven for 40 hours at 60° C.

TABLE 1

| Transistor | Characteristic change (ΔVth) |
|---|---|
| T2 | 8.6 |
| T3 | 10.3 |
| T4 | 0.02 |
| T5 | 1.3 |
| T6 | 0.7 |
| T7 | 9.5 |

As shown in Table 1, threshold voltages of the third and seventh transistors T3 and T7 are most greatly changed to 10.3 V and 9.5 V, respectively, and a threshold voltage of the second transistor T2 is considerably changed to 8.6 V.

The characteristic change of the third and seventh transistors T3 and T7 leads to their malfunction, causing a plurality of output signals to be outputted in one frame. In the normal state, one stage generates one output signal in one frame. However, when the third and seventh transistors T3 and T7 malfunction, several output signals may be generated in one frame as shown in FIG. 4.

FIG. 4 is a graph illustrating abnormal signals outputted due to the degradation of the gate driver shown in FIG. 1. Referring to FIG. 4, when the third and seventh transistors T3 and T7 are driven for a long time and are degraded, their threshold voltages may be increased. When the threshold voltage is increased, the fourth transistor T4 is turned on by the second clock C2. Although the second supply voltage VDD is charged on the node QB, the third transistor T3 cannot be turned on by the second voltage VDD of the charge node QB. When the third transistor T3 is not turned on, the node Q is not discharged, causing the sixth transistor T6 to be turned on. Periodic pulses of a high state are outputted as the output signals through the sixth transistor T6. Therefore, although one stage must output only one normal output signal in one frame so as to activate the corresponding gate line, abnormal output signals other than the normal output signal is outputted in one frame and the gate lines are frequently activated, causing unwanted pixels to be displayed. These abnormal output signals causes blurring and fluttering, causing degradation in the reliability of the gate driver.

Since the threshold voltage of the second transistor T2 is increased due to the degradation thereof and thus is not turned off, the start pulse signal SP cannot be charged on the node Q. Accordingly, the gate driver is abnormally driven and thus its reliability is degraded.

SUMMARY OF THE INVENTION

A built-in gate driver improves the image quality and the reliability of a gate driver and a display device having the same. The built-in gate driver prevents a possible malfunction due to the related art second transistor T2 by removing the related art second transistor T2 and connecting the previous shift register stage's output signal to the node Q through only one transistor.

Additionally, the Q node of the built-in gate driver may be rapidly discharged by providing a transistor connected to the Q node and which is controlled by the output signal of a next stage. This configuration may prevent the multi-output signals generated as a result of the reduced discharge of the Q node caused by the degradation of the transistor controlled by a QB node.

Additionally, by removing the transistor for controlling the charge of the start pulse signal on the Q node the built-in gate driver makes it possible to prevent the malfunction of the built-in gate driver when the transistor connected to the a clock signal is degraded by a periodic high clock signal.

A built-in gate driver includes: a plurality of stages connected in cascade to sequentially output corresponding output signals, each of the stages includes: a first transistor having a gate and drain commonly connected to an output signal of a previous stage, and a source connected to a first node; a second transistor having a gate connected to the output signal of the previous stage, a drain connected to a second node, and a source connected to a first supply voltage; a fourth transistor having a gate connected to one of first and second clocks, a drain connected to a second supply voltage, and a source connected to the second node; a fifth transistor having a gate connected to the first node, a drain connected to the other of the first and second clocks, and a source connected to an output signal of a current stage; a sixth transistor having a gate connected to the second node, a drain connected to the first node, and a source connected to the first supply voltage; a seventh transistor having a gate connected to the second node, a drain connected to the output signal of the current stage, and a source connected to the first supply voltage; and an eighth transistor having a gate connected to an output signal of a next stage, a drain connected to the first node, and a source connected to the first supply voltage.

Additionally, a display device may include: a display panel including pixels arranged in a matrix to display an image; a gate driver built in the display panel to supply output signals corresponding to gate lines of the display panel; and a data driver for supplying the image to data lines of the display panel, wherein the gate driver comprises a plurality of stages connected in cascade to sequentially output corresponding output signals, each of the stages including: a first transistor having a gate and drain commonly connected to an output signal of a previous stage, and a source connected to a first node; a second transistor having a gate connected to the output signal of the previous stage, a drain connected to a second node, and a source connected to a first supply voltage; a fourth transistor having a gate connected to one of first and second clocks, a drain connected to a second supply voltage, and a source connected to the second node; a fifth transistor having a gate connected to the first node, a drain connected to the other of the first and second clocks, and a source connected to an output signal of a current stage; a sixth transistor having a gate connected to the second node, a drain connected to the first node, and a source connected to the first supply voltage; a seventh transistor having a gate connected to the second node, a drain connected to the output signal of the current stage, and a source connected to the first supply voltage; and an eighth transistor having a gate connected to an output signal of a next stage, a drain connected to the first node, and a source connected to the first supply voltage.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
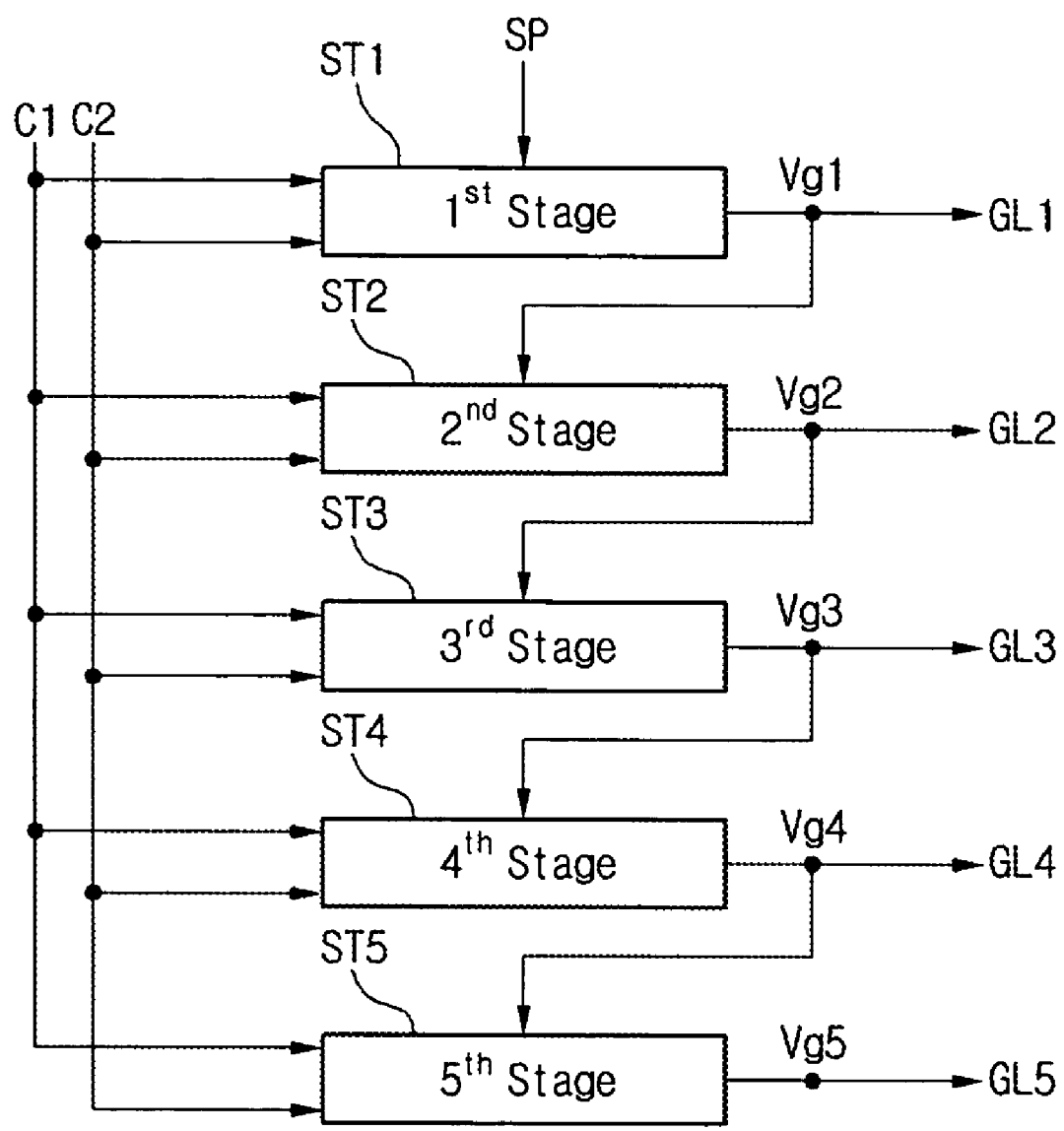
FIG. 1 is a block diagram of a related art gate driver.
Figure 2:
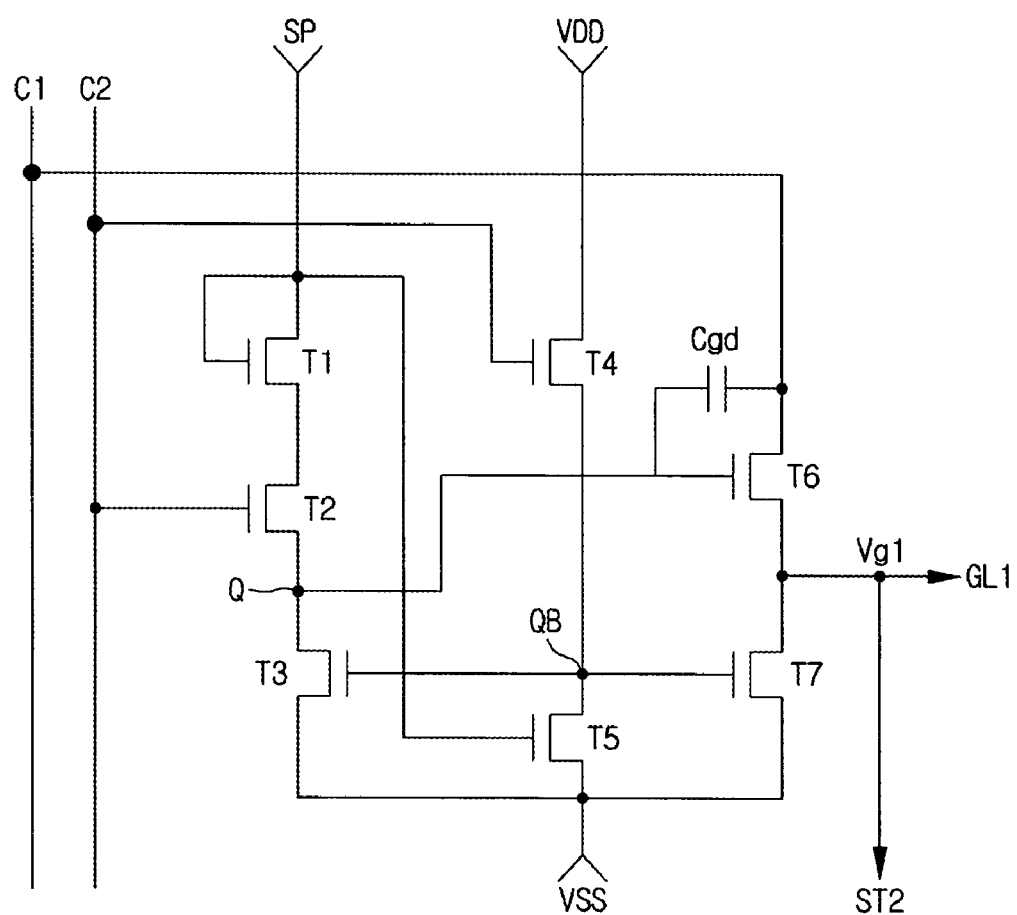
FIG. 2 is a detailed circuit diagram of a first stage shown in FIG. 1.
Figure 3:
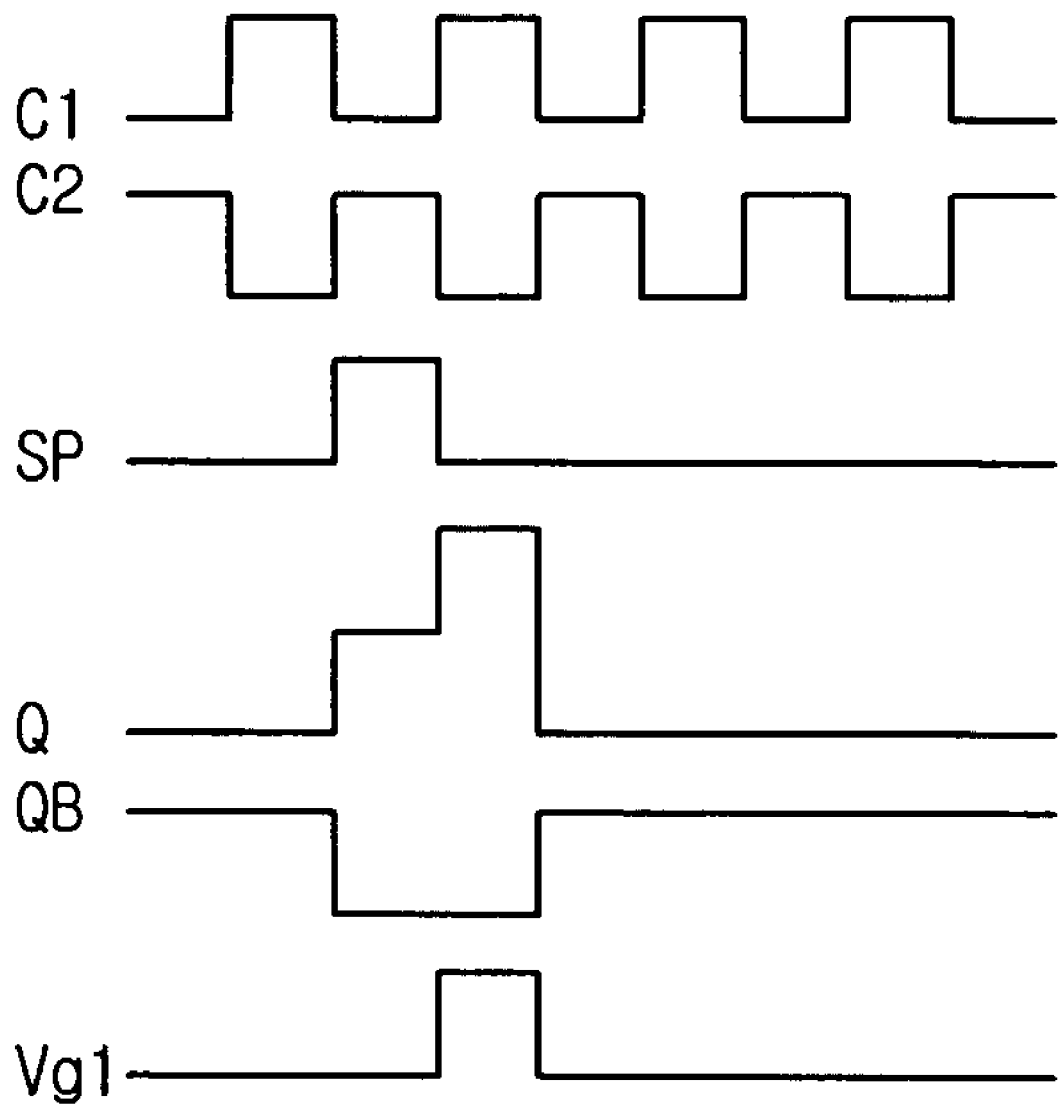
FIG. 3 illustrates driving waveforms for the gate driver shown in FIG. 2.
Figure 4:
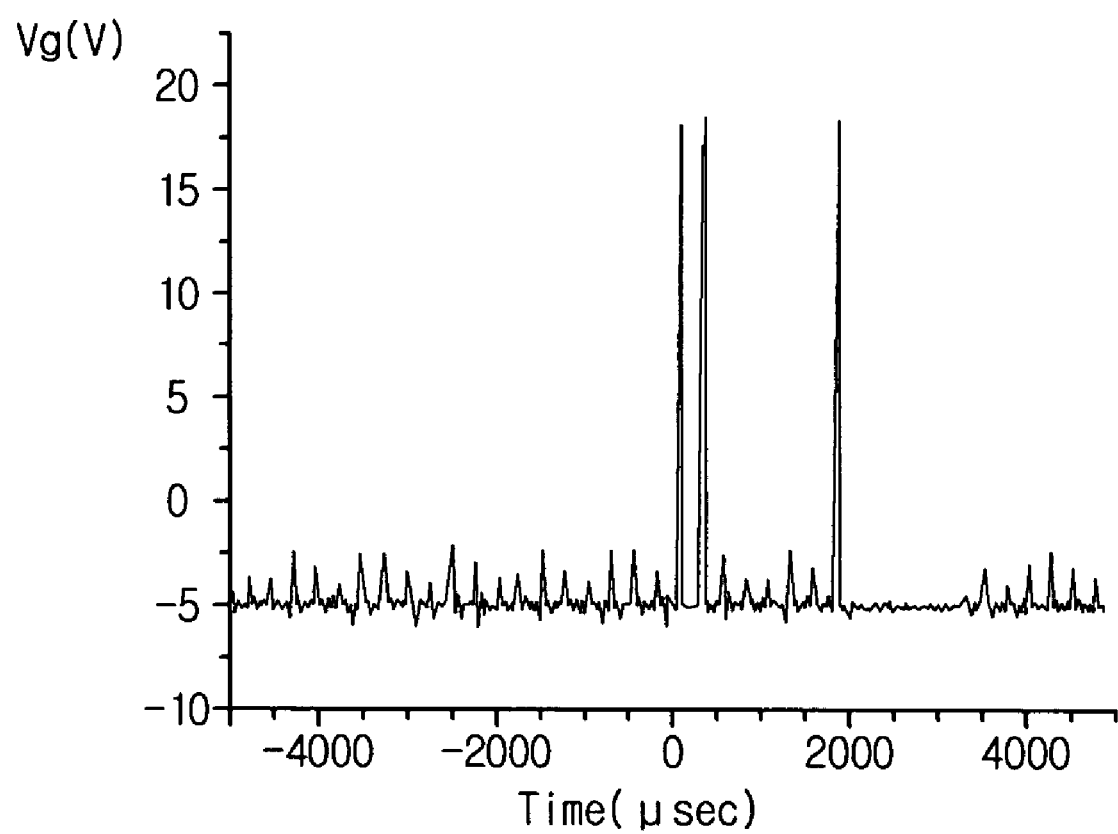
FIG. 4 is a graph illustrating abnormal signals outputted due to the degradation of the gate driver shown in FIG. 2.
Figure 5:
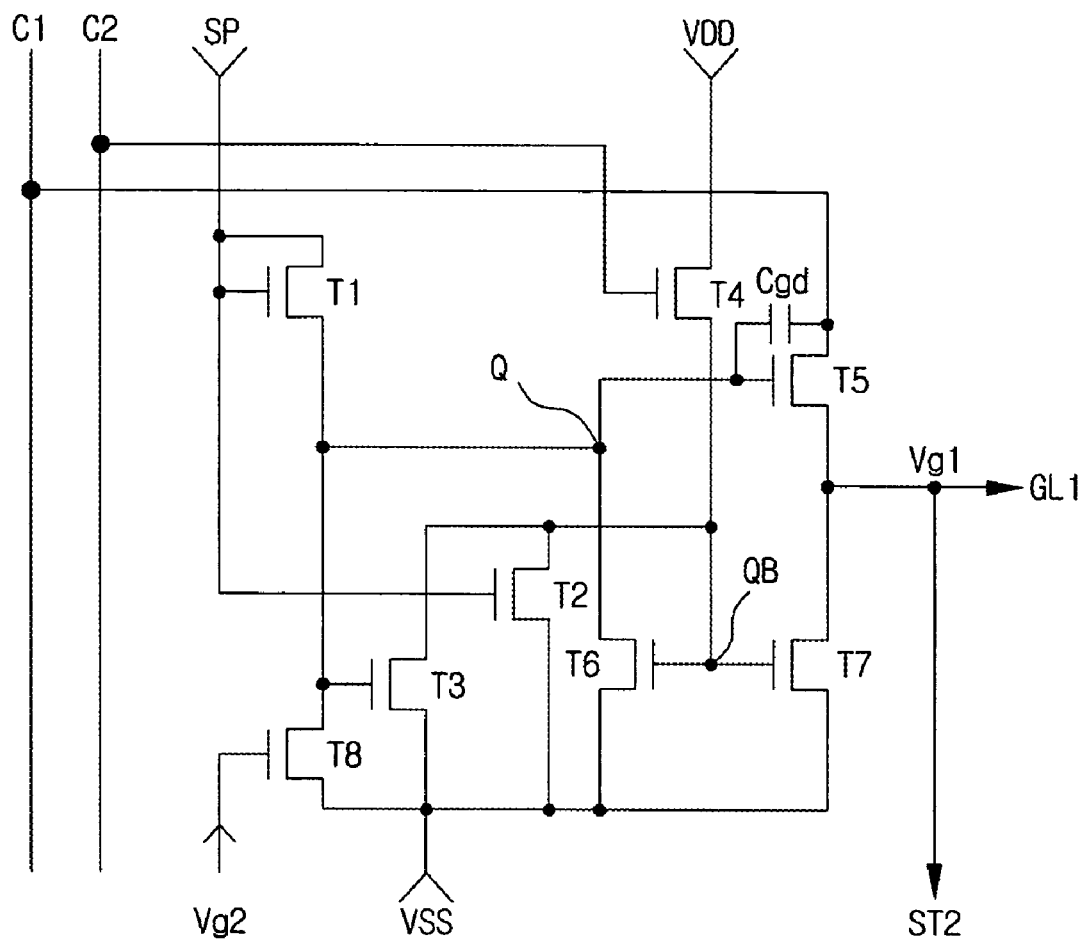
FIG. 5 is a detailed circuit diagram of a first stage of a gate driver.
Figure 6:
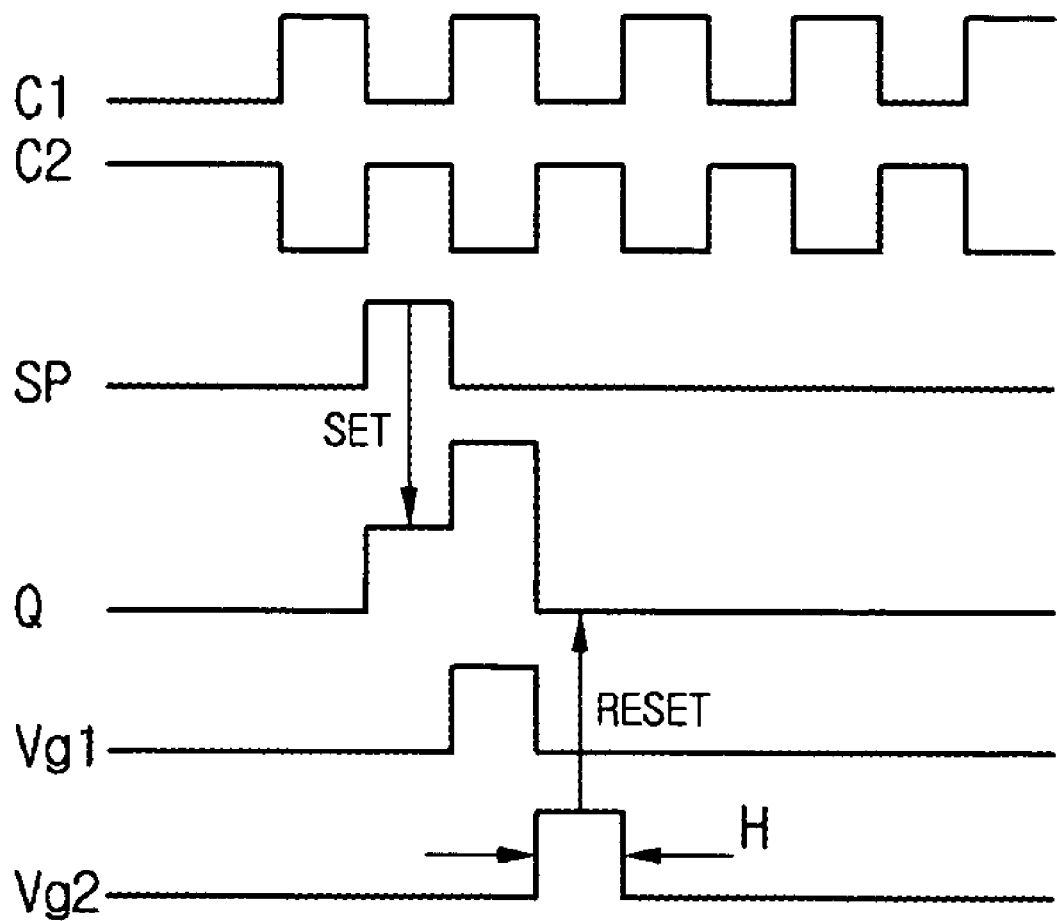
FIG. 6 illustrates driving waveforms for the gate driver shown in FIG. 5.

FIG. 5 is a detailed circuit diagram of a first stage of a built-in gate driver. FIG. 6 illustrates driving waveforms for the circuit shown in FIG. 5. The built-in gate driver is configured using one shift resister including a plurality of stages ST1 to STn connected in cascade. Since the stages have the same transistor circuit structure, only a first stage ST1 is illustrated in FIG. 5.

Referring to FIG. 5, a first stage ST1 includes first to eighth transistors T1 to T8. The first transistor T1 has a gate and a drain commonly connected to the start pulse signal SP and a source connected to a node Q. In the case of the other stages, an output signal of a previous stage may be connected to a gate and drain of the first transistor T1.

The second transistor T2 has a gate connected to a start pulse signal SP, a drain connected to a node QB, and a source connected to a first supply voltage VSS.

The third transistor T3 has a gate connected to the node Q, a drain connected to the node QB, and a source connected to the first supply voltage VSS.

The fourth transistor T4 has a gate connected to the second clock C2, a drain connected to a second supply voltage VDD, and a source connected to the node QB.

The fifth transistor T5 has a gate connected to the node Q, a drain connected to a first clock C1, and a source connected to a first gate line GL1.

The sixth transistor T6 has a gate connected to the node QB, a drain connected to the node Q, and a source connected to the first supply voltage VSS.

The seventh transistor T7 has a gate connected to the node QB, a drain connected to the first gate line GL1, and a source connected to the first supply voltage VSS.

The eighth transistor T8 has a gate connected to an output signal Vg2 of a next stage, a drain connected to the node Q, and a source connected to the first supply voltage VSS.

An operation of the first stage ST1 will be described with reference to FIGS. 5 and 6. Referring to FIG. 6, the first clock C1 generates a first periodic pulse and the second clock C2 generates a second periodic pulse. A phase of the first periodic pulse is opposite to that of the second periodic pulse. The start pulse SP is generated in synchronization with the second clock C2.

When the second clock C2 and the start pulse signal SP are at a high state, the start pulse signal SP is charged on the node Q via the first transistor T1. The first transistor T1 serves as a diode. In the first transistor T1, a current flows in the forward direction (from drain to source) and does not flow in the reverse direction (from source to drain). When the start pulse signal SP is at a high state the signal is applied to the drain of the first transistor T1, as well as to the gate of the T1. Accordingly, the first transistor T1 is turned on and the start pulse signal SP passes through the first transistor T1. The start pulse signal SP charged on the node Q is blocked by the first transistor T1 and is prevented from being discharged. The node Q is set (initialized) by the start pulse signal SP. While the start pulse signal SP is charged on the node Q, the second transistor T2 is turned on by the start pulse signal SP and the node QB is discharged. Meanwhile, the fourth transistor T4 is turned on by the second clock C2 and the second supply voltage VDD is charged on the node QB. At this time, the third transistor T3 is turned on by the start pulse signal SP and the node QB is discharged. Accordingly, the node QB is maintained at a low voltage. Since the third transistor T3 is turned on by the charged start pulse signal SP at the node Q and the node QB is additionally discharged to the first supply voltage VSS, the node QB can be maintained at a low voltage. The node QB can also be maintained at a low voltage when the first clock C1 is applied. When clock C1 is applied, the second clock C2 is at a low state. At this time, the third transistor T3 is turned on by the charged start pulse signal SP at the node Q.

Next, when the second clock C2 is at a high state and the first clock is at a low state, the node Q is discharged via transistor T6 and accordingly the third transistor T3 is turned off.

Referring back to FIG. 6 when the first clock c1 is at a high state for the first time after the SP signal, a voltage of the node Q is increased about twice due to a bootstrapping phenomenon caused by a floating state of the node Q. When the first clock C1 is at a high state the second clock C2 is at a low state. The sixth transistor T6 is turned off by the node QB being at a low state, the eighth transistor T8 is turned off because an output signal Vg2 of the next stage is not yet outputted, and the first transistor T1 is turned off in a reverse direction, causing the node Q to be at a floating state. Because the first clock C1 is at a high state the fifth transistor T5 is turned on and the voltage of the node Q is increased by the first clock C1 due to a capacitor Cgd between the gate and drain of the fifth transistor T5. While the fifth transistor T5 is turned on and the first clock C1 is outputted as a first output signal Vg1. At this time, the third transistor T3 is turned on by the charged start pulse signal SP at the node Q and the node QB is maintained at the first supply voltage VSS at a low state. While the first clock C1 is at a high state, the first output signal is outputted from the first state ST1. Similarly, when the second clock C2 transitions to a high state, that is, a next clock signal, the second output signal Vg2 is outputted from the second stage ST2. When the next first clock C1 is generated a third output signal Vg3 (not shown in FIG. 6) is outputted from the third stage ST3. As the first and second clocks C1 and C2 alternate between high and low states, output signals are sequentially outputted from the respective stages.

When the second clock C2 is again inputted, the fourth transistor T4 is turned on and thus the second supply voltage VDD is charged on the node QB. The sixth and seventh transistors T6 and T7 are turned on by the second supply voltage VDD at the node QB. While the node Q is discharged through the sixth transistor T6, the first gate line GL1 is discharged through seventh transistor T7. The node Q is reset to the second supply voltage VDD. Simultaneously, the node Q is discharged using the eighth transistor T8 controlled by the output signal Vg2 of the next stage. As described above, when the second clock C2 is generated, the second output signal Vg2 is outputted from the second stage ST2. At this time, since the gate of the first stage ST1 is connected to the output port of the second stage ST2, the second output signal Vg2 from the second stage ST2 is supplied not only to the second gate line but also to the gate of the third transistor T3 of the first stage ST1. Accordingly, the third transistor T3 is turned on and thus the node QB is discharged to the first supply voltage VSS.

This process is repeated per frame. The first output signal Vg1 is outputted from the first stage ST1 once per frame. A similar output signal is outputted from each of the remaining stages ST2 to STn once per frame. The respective output signals of the respective frames are delayed on a clock basis and thus are sequentially outputted.

The eighth transistor T8 is further provided to rapidly discharge the node Q even when the sixth transistor T6 is not turned off as a result of an increased threshold voltage. As described above, the eighth transistor T8 has the gate connected to the output signal Vg2 of the next stage, the drain connected to the node Q, and the source connected to the first supply voltage VSS. In a normal state, the output signal Vg2 of the next stage is outputted once per frame. This output signal Vg2 has a duty cycle of one period H. The output signal Vg2 becomes a high state only for a short time and becomes a low state for the remaining period. The eighth transistor T8 is turned on by the output signal Vg2 at a high state from the next stage and thus the node Q is discharged to the first supply voltage VSS. Since the output signal Vg2 of a high state is applied to the gate of the eighth transistor T8 only for the one period H during one frame, the eighth transistor T8 is not degraded even when it is driven for a long time. The node Q, which may not be discharged due to the degradation of the sixth transistor T6, can be rapidly discharged due to the eighth transistor T8 controlled by the output signal Vg2 of the next stage. The fifth transistor T5 is normally turned off and thus the first output signal Vg1 can be outputted only one time from the first stage ST1.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A built-in gate driver comprising:
a shift register housing a plurality of shift register stages arranged from a first stage to an Nth stage, connected in cascade to sequentially output corresponding output signals, each of the plurality of shift register stages includes:
a first transistor having a gate and drain commonly connected to an output signal of a previous stage, and a source connected to a first node;
a second transistor having a gate connected to the output signal of the previous stage, a drain connected to a second node, and a source connected to a first supply voltage;
a third transistor having a gate connected to the first node, a drain connected to the second node, and a source connected to the first supply voltage;
a fourth transistor having a gate connected to one of first and second clocks, a drain connected to a second supply voltage, and a source connected to the second node;
a fifth transistor having a gate connected to the first node, a drain connected to the other of the first and second clocks, and a source connected to an output signal of a current stage;
a sixth transistor having a gate connected to the second node, a drain connected to the first node, and a source connected to the first supply voltage;
a seventh transistor having a gate connected to the second node, a drain connected to the output signal of the current stage, and a source connected to the first supply voltage; and
an eighth transistor having a gate connected to an output signal of a next stage, a drain connected to the first node, and a source connected to the first supply voltage,
when the eighth transistor is tuned on by the output signal at a high state from the next stage, the first node is discharged to the first supply voltage, and
wherein the third transistor of odd numbered stages of the plurality of shift register stages are sequentially turned on during sequential even numbered periods.

2. The driver according to claim 1, wherein all but the Nth shift register stage of the plurality of shift register stages, is reset by an output signal of a next sequential shift register stage of the plurality of shift register stages.

3. The driver according to claim 1, wherein each of the plurality of shift register stages is reset by its second node.

4. The driver according to claim 1, wherein the output signal of a previous shift register stage of the plurality of shift register stages is a start signal for a current shift register stage of the plurality of shift register stages.

* * * * *